(12) United States Patent
McCamy et al.

(10) Patent No.: US 11,031,514 B2
(45) Date of Patent: Jun. 8, 2021

(54) SOLAR CELL WITH SELECTIVELY DOPED CONDUCTIVE OXIDE LAYER AND METHOD OF MAKING THE SAME

(71) Applicant: Vitro S.A.B. de C.V., Nuevo Leon (MX)

(72) Inventors: James W. McCamy, Export, PA (US); Peter Tausch, Decatur, IL (US); Gary J. Nelis, Pittsburgh, PA (US); Ashtosh Ganjoo, Allison Park, PA (US)

(73) Assignee: Vitro, S.A.B. de C.V., Nuevo León (MX)

( * ) Notice: Subject to any disclaimer, the term of this patent is extended or adjusted under 35 U.S.C. 154(b) by 12 days.

(21) Appl. No.: 15/905,123

(22) Filed: Feb. 26, 2018

(65) Prior Publication Data

US 2018/0190844 A1 Jul. 5, 2018

Related U.S. Application Data

(62) Division of application No. 14/200,443, filed on Mar. 7, 2014, now abandoned.
(Continued)

(51) Int. Cl.
| | |
|---|---|
| *H01L 31/032* | (2006.01) |
| *C03C 17/34* | (2006.01) |
| *C03C 17/36* | (2006.01) |
| *H01L 31/0224* | (2006.01) |
| *C23C 16/40* | (2006.01) |
| *C23C 16/455* | (2006.01) |

(Continued)

(52) U.S. Cl.
CPC ...... *H01L 31/0321* (2013.01); *C03C 17/3411* (2013.01); *C03C 17/3482* (2013.01); *C03C 17/3618* (2013.01); *C03C 17/3636* (2013.01); *C03C 17/3649* (2013.01); *C03C 17/3655* (2013.01); *C03C 17/3678* (2013.01); *C23C 16/407* (2013.01); *C23C 16/45595* (2013.01); *C23C 16/545* (2013.01); *H01L 31/022466* (2013.01); *H01L 31/1884* (2013.01); *C03C 2217/91* (2013.01); *C03C 2217/94* (2013.01); *Y02E 10/50* (2013.01)

(58) Field of Classification Search
CPC ..... H01L 31/022466; H01L 31/022475; H01L 31/022483
See application file for complete search history.

(56) References Cited

U.S. PATENT DOCUMENTS

| | | |
|---|---|---|
| 4,571,448 A | 2/1986 | Barnett |
| 4,598,306 A | 7/1986 | Nath et al. |
| | (Continued) | |

FOREIGN PATENT DOCUMENTS

| | | |
|---|---|---|
| CN | 1809898 A | 7/2006 |
| CN | 101310391 A | 11/2008 |
| | (Continued) | |

*Primary Examiner* — Matthew T Martin
(74) *Attorney, Agent, or Firm* — The Webb Law Firm

(57) ABSTRACT

A method of making a coated substrate having a transparent conductive oxide layer with a dopant selectively distributed in the layer includes selectively supplying an oxide precursor material and a dopant precursor material to each coating cell of a multi-cell chemical vapor deposition coater, wherein the amount of dopant material supplied is selected to vary the dopant content versus coating depth in the resultant coating.

6 Claims, 13 Drawing Sheets

Related U.S. Application Data

(60) Provisional application No. 61/777,316, filed on Mar. 12, 2013.

(51) Int. Cl.
*C23C 16/54* (2006.01)
*H01L 31/18* (2006.01)

(56) References Cited

U.S. PATENT DOCUMENTS

| | | |
|---|---|---|
| 4,638,111 A | 1/1987 | Gay |
| 4,746,347 A | 5/1988 | Sensi |
| 4,792,536 A | 12/1988 | Pecoraro et al. |
| 5,030,593 A | 7/1991 | Heithoff |
| 5,030,594 A | 7/1991 | Heithoff |
| 5,240,886 A | 8/1993 | Gulotta et al. |
| 5,385,872 A | 1/1995 | Gulotta et al. |
| 5,393,593 A | 2/1995 | Gulotta et al. |
| 6,218,018 B1 | 4/2001 | McKown et al. |
| 6,797,388 B1 | 9/2004 | Szanyi et al. |
| 8,071,872 B2 | 12/2011 | Atanackovic |
| 2006/0261447 A1 | 11/2006 | Seto et al. |
| 2008/0223436 A1 | 9/2008 | den Boer et al. |
| 2008/0308143 A1 | 12/2008 | Atanackovic |
| 2009/0025791 A1 | 1/2009 | Matsui |
| 2009/0255569 A1 | 10/2009 | Sampsell et al. |
| 2012/0090676 A1 | 4/2012 | Lin et al. |
| 2013/0298987 A1 * | 11/2013 | Losio .................. H01L 31/1884 136/256 |
| 2013/0337603 A1 * | 12/2013 | Steinhauser .......... H01L 31/202 438/96 |

FOREIGN PATENT DOCUMENTS

| | | |
|---|---|---|
| CN | 102239221 A | 11/2011 |
| EP | 1635361 A1 | 3/2006 |
| JP | 63199863 A | 8/1988 |
| JP | 11186580 A | 7/1999 |
| WO | 2004112057 A1 | 12/2004 |
| WO | 2007058118 A1 | 5/2007 |
| WO | 2010059507 A1 | 5/2010 |
| WO | WO-2012098052 A1 * | 7/2012 .......... H01L 31/076 |

* cited by examiner

SOLAR CELL WITH SELECTIVELY DOPED CONDUCTIVE OXIDE LAYER AND METHOD OF MAKING THE SAME

CROSS REFERENCE TO RELATED APPLICATION

This application claims priority to U.S. patent application Ser. No. 14/200,443, filed Mar. 7, 2014, which claims priority to U.S. Provisional Application No. 61/777,316, filed Mar. 12, 2013, herein incorporated by reference in its entirety.

BACKGROUND OF THE INVENTION

1. Field of the Invention

This invention relates generally to solar cells, e.g., photovoltaic (PV) cells, and, more particularly, to a solar cell having a selectively doped transparent conductive oxide layer and a method of making the same.

2. Technical Considerations

A solar cell or photovoltaic (PV) cell is an electronic device that directly converts sunlight into electricity. Light shining on the solar cell produces both a current and a voltage to generate electric power. In a solar cell, photons from sunlight hit the solar cell and are adsorbed by a semiconducting material. Electrons are knocked loose from their atoms, causing an electric potential difference. Current flows through the material to cancel the potential difference. Due to the special composition of solar cells, the electrons are only allowed to move in a single direction.

A conventional amorphous silicon thin film solar cell typically includes a glass substrate (cover plate) over which is provided an underlayer, a transparent conductive oxide (TCO) contact layer, and an amorphous silicon thin film active layer having a p-n junction. A rear metallic layer acts as a reflector and back contact. The TCO layer preferably has an irregular surface to increase light scattering. In solar cells, light scattering or "haze" is used to trap light in the active region of the cell. The more light that is trapped in the cell, the higher the efficiency that can be obtained. However, the haze cannot be so great as to adversely impact upon the transparency of light through the TCO layer. Therefore, light trapping is an important issue when trying to improve the efficiency of solar cells and is particularly important in thin film cell design. It is also desirable if the TCO layer is highly transparent to permit the maximum amount of solar radiation to pass to the silicon layer. As a general rule, the more photons that arrive at the semiconductor material, the higher the efficiency of the cell. Further, the TCO layer should be highly conductive to allow the easy transfer of electrons in the cell. This conductivity can be enhanced by the addition of a dopant material to the TCO material.

The TCO layer is an important factor in solar cell performance. The TCO material should preferably have a high conductivity (i.e., low sheet resistance), a high transparency in the desired region of the electromagnetic spectrum, and should have high haze to promote light scattering. However, these factors are interwoven with each other. For example, conductivity is dependent upon the dopant concentration and the thickness of the TCO layer. However, increasing the dopant concentration or the thickness of the TCO layer generally decreases the transparency of the TCO layer. Further, surface roughness (light scattering) generally increases with coating thickness. However, increasing the coating thickness generally decreases the transmission (particularly visible light transmission) through the coating. Thus, the affect and interaction of each of these factors must be weighed when selecting a TCO layer for a solar cell.

It would be desirable to provide a TCO layer in which the conductivity, light transmission, and light scattering could more easily be selected. It would also be desirable to provide a method of providing a TCO layer for a solar cell in which these factors could be controlled more easily. It would also be desirable to provide a solar cell having such a TCO layer.

SUMMARY OF THE INVENTION

A solar cell comprises a first substrate having a first surface and a second surface. A first conductive layer is provided over at least a portion of the second surface, wherein the first conductive layer comprises a transparent conductive oxide layer incorporating a dopant material. The dopant material is selectively distributed in the conductive layer. A semiconductor layer is provided over the transparent first conductive layer. A second conductive layer is provided over at least a portion of the semiconductor layer.

A method of making a coated substrate having a transparent conductive oxide layer with a dopant selectively distributed in the layer comprises selectively supplying an oxide precursor material and a dopant precursor material to each coating cell of a multi-cell chemical vapor deposition coater, wherein the amount of dopant material supplied is selected to vary the dopant content versus coating depth in the resultant coating.

A chemical vapor deposition system comprises at least one coater having a plurality of coating cells, wherein the coating cells are connected to one or more coating supply sources comprising at least one oxide precursor material and at least one dopant material. In a preferred embodiment, the coating cells are individually connected to respective coating supply sources comprising at least one oxide precursor material and at least one dopant material.

A method of making a coated substrate having a coating layer with a dopant selectively distributed in the coating layer comprises: supplying a coating precursor material to coating cells of a multi-cell chemical vapor deposition coater; supplying a dopant precursor material to coating cells of a multi-cell chemical vapor deposition coater; controlling the supply of at least one of the coating precursor material and the dopant precursor material to define a coating composition having a selected ratio of the dopant precursor material to the coating precursor material at the coating cells; and depositing the coating composition onto a substrate to form a doped coating layer. The ratio of the dopant precursor material to the coating precursor material is selected to define a desired dopant content versus coating depth profile of a resultant doped coating.

At least a portion of the coating cells can be individually connected to a coating precursor supply and a dopant precursor supply.

BRIEF DESCRIPTION OF THE DRAWINGS

A complete understanding of the invention will be obtained from the following description when taken in connection with the accompanying drawing figures.

DESCRIPTION OF THE PREFERRED EMBODIMENTS

Figure 1:
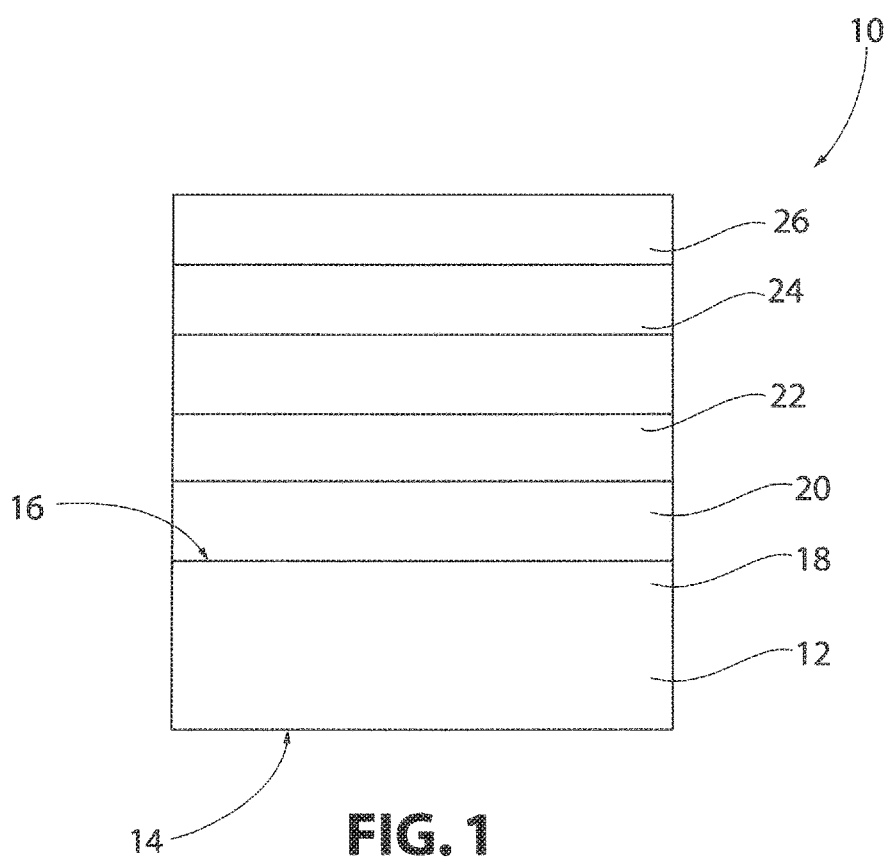
FIG. 1 is a side, sectional view (not to scale) of a solar cell incorporating features of the invention.

As used herein, spatial or directional terms, such as "left", "right", "inner", "outer", "above", "below", and the like, relate to the invention as it is shown in the drawing figures. However, it is to be understood that the invention can assume various alternative orientations and, accordingly, such terms are not to be considered as limiting. Further, as used herein, all numbers expressing dimensions, physical characteristics, processing parameters, quantities of ingredients, reaction conditions, and the like, used in the specification and claims are to be understood as being modified in all instances by the term "about". Accordingly, unless indicated to the contrary, the numerical values set forth in the following specification and claims may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to encompass the beginning and ending range values and any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 1 to 3.3, 4.7 to 7.5, 5.5 to 10, and the like. Further, as used herein, the terms "formed over", "deposited over", "provided over", or "located over" mean formed, deposited, provided, or located on a surface but not necessarily in direct contact with the surface. For example, a coating layer "formed over" a substrate does not preclude the presence of one or more other coating layers or films of the same or different composition located between the formed coating layer and the substrate. As used herein, the terms "polymer" or "polymeric" include oligomers, homopolymers, copolymers, and terpolymers, e.g., polymers formed from two or more types of monomers or polymers. The terms "visible region" or "visible light" refer to electromagnetic radiation having a wavelength in the range of 380 nm to 760 nm. The terms "infrared region" or "infrared radiation" refer to electromagnetic radiation having a wavelength in the range of greater than 760 nm to 100,000 nm. The terms "ultraviolet region" or "ultraviolet radiation" mean electromagnetic energy having a wavelength in the range of 200 nm to less than 380 nm. The terms "microwave region" or "microwave radiation" refer to electromagnetic radiation having a frequency in the range of 300 megahertz to 300 gigahertz. Additionally, all documents, such as, but not limited to, issued patents and patent applications, referred to herein are to be considered to be "incorporated by reference" in their entirety. In the following discussion, the refractive index values are those for a reference wavelength of 550 nanometers (nm). The term "film" refers to a region of a coating having a desired or selected composition. A "layer" comprises one or more "films". A "coating" or "coating stack" is comprised of one or more "layers".

Although the invention will be described with respect to use with a solar cell, it is to be understood that the invention is not limited to use with solar cells but could be used in other applications, such as architectural glazings, organic light-emitting diodes, or solar control transparencies.

An exemplary solar cell 10 incorporating features of the invention is shown in FIG. 1. The solar cell 10 includes a first (outer) substrate 12 having a first (outer) major surface 14 and a second (inner) major surface 16. By "outer" is meant the surface facing the incident radiation, e.g., sunlight. An optional undercoating 18 may be located over the second surface 16. A first conductive layer 20 (for example a TCO layer) is located over the second surface 16 (such as on the undercoating 18, if present). A semiconductor layer 22 is located over the TCO layer 20. A second conductive layer 24 is located over the semiconductor layer 22. For example, the second conductive layer 24 can be a metal layer or a metal-containing layer. An optional second (inner) substrate 26 is located over the second conductive layer 24.

In the broad practice of the invention, the first substrate 12 (and optional second substrate 26, if present) can include any desired material having any desired characteristics. For example, the first substrate 12 can be transparent or translucent to visible light. By "transparent" is meant having a visible light transmittance of greater than 0% up to 100%. Alternatively, the first substrate 12 can be translucent. By "translucent" is meant allowing electromagnetic energy (e.g., visible light) to pass through but diffusing this energy such that objects on the side opposite the viewer are not clearly visible. Examples of suitable materials include, but are not limited to, plastic substrates (such as acrylic polymers, such as polyacrylates; polyalkylmethacrylates, such as polymethylmethacrylates, polyethylmethacrylates, polypropylmethacrylates, and the like; polyurethanes; polycarbonates; polyalkylterephthalates, such as polyethyleneterephthalate (PET), polypropyleneterephthalates, polybutyleneterephthalates, and the like; polysiloxane-containing polymers; or copolymers of any monomers for preparing these, or any mixtures thereof); glass substrates; or mixtures or combinations of any of the above. For example, the first substrate 12 can include conventional soda-lime-silicate glass, borosilicate glass, or leaded glass. The glass can be clear glass. By "clear glass" is meant non-tinted or non-colored glass. Alternatively, the glass can be tinted or otherwise colored glass. The glass can be annealed or heat-treated glass. As used herein, the term "heat treated" means tempered or at least partially tempered. The glass can be of any type, such as conventional float glass, and can be of any composition having any optical properties, e.g., any value of visible transmission, ultraviolet transmission, infrared transmission, and/or total solar energy transmission. By "float glass" is meant glass formed by a conventional float process in which molten glass is deposited onto a molten metal bath, such as molten tin. The bottom side of the glass, i.e., the side that was in contact with the molten tin bath, conventionally is referred to as the "tin side" and the top side of the glass conventionally is referred to as the "air side". The tin side of the glass can have small amounts of tin incorporated into the glass surface. Non-limiting examples of glass that can be used for the practice of the invention include Solargreen®, Solextra®, GL-20®, GL-35™, Solarbronze®, Starphire®, Solarphire®, Solarphire PV® and Solargray® glass, all commercially available from PPG Industries Inc. of Pittsburgh, Pa.

The first substrate 12 can be of any desired dimensions, e.g., length, width, shape, or thickness. For example, the first substrate 12 can be planar, curved, or have both planar and curved portions. In one non-limiting embodiment, the first substrate 12 can have a thickness in the range of 0.5 mm to 10 mm, such as 1 mm to 5 mm, such as 2 mm to 4 mm, such as 3 mm to 4 mm.

The first substrate 12 can have a high visible light transmission at a reference wavelength of 550 nanometers (nm) and a reference thickness of 2 mm. By "high visible light transmission" is meant visible light transmission at 550 nm of greater than or equal to 85%, such as greater than or equal to 87%, such as greater than or equal to 90%, such as greater than or equal to 91%, such as greater than or equal to 92%, such as greater than or equal to 93%.

The optional undercoating 18, if present, can be a single layer or a multilayer coating having a first layer and a second layer over the first layer. The undercoating 18 can provide a barrier between the first substrate 12 and the overlying coating layers. Silica is known to provide good barrier properties, particularly as a barrier to sodium ion diffusion out of a glass substrate. Alternatively, the undercoating 18 can be a mixture of two or more oxides, such as selected from oxides of silicon, titanium, aluminum, tin, zirconium, phosphorous. The oxides can be present in any desired proportions. The second layer of the undercoating 18, if present, can be a homogeneous coating. Alternatively, the second layer can be a gradient coating with the relative proportions of at least two of the constituents of the coating varying through the coating thickness.

The TCO layer 20 comprises at least one conductive oxide layer, such as a doped oxide layer. For example, the TCO layer 20 can include one or more oxide materials, such as but not limited to, one or more oxides of one or more of Zn, Fe, Mn, Al, Ce, Sn, Sb, Hf, Zr, Ni, Zn, Bi, Ti, Co, Cr, Si, In, or an alloy of two or more of these materials, such as zinc stannate. The TCO layer 20 can also include one or more dopant materials, such as but not limited to, F, In, Al, P, Cu, Mo, Ta, Ti, Ni, Nb, W, and/or Sb.

The TCO layer 20 can have a thickness greater than 200 nm, such as greater than 250 nm, such as greater than 350 nm, such as greater than 380 nm, such as greater than 400 nm, such as greater than 420 nm, such as greater than 470 nm, such as greater than 500 nm, such as greater than 600 nm. For example, The TCO layer can have a thickness in the range of 350 nm to 1,000 nm, such as 400 nm to 800 nm, such as 500 nm to 700 nm, such as 600 nm to 700 nm.

The TCO layer 20 can have a surface resistivity (sheet resistance) of less than 20 ohms per square ($\Omega/\square$), such as less than 15$\Omega/\square$, such as less than 14$\Omega/\square$, such as less than 13.5$\Omega/\square$, such as less than 13$\Omega/\square$, such as less than 12$\Omega/\square$, such as less than 11$\Omega/\square$, such as less than 10 $\Omega/\square$.

The TCO layer 20 can have a surface roughness (RMS) in the range of 5 nm to 60 nm, such as 5 nm to 40 nm, such as 5 nm to 30 nm, such as 10 nm to 30 nm, such as 10 nm to 20 nm, such as 10 nm to 15 nm, such as 11 nm to 15 nm. The surface roughness of the first undercoating layer will be less than the surface roughness of the TCO layer 20.

In a preferred embodiment, the TCO layer 20 is a fluorine doped tin oxide coating, with the fluorine present in an amount less than 20 wt. % based on the total weight of the coating, such as less than 15 wt. %, such as less than 13 wt. %, such as less than 10 wt. %, such as less than 5 wt. %, such as less than 4 wt. %, such as less than 2 wt. %, such as less than 1 wt. %. The TCO layer 20 can be amorphous, crystalline, or at least partly crystalline. However, unlike prior TCO layers, the TCO layer of the invention does not necessarily have a uniform doping profile throughout the coating thickness. In the practice of the invention, the dopant content can be selected or varied in selected regions of the TCO layer by the TCO layer formation process described below.

In one preferred embodiment, the TCO layer 20 comprises fluorine doped tin oxide and has a thickness in the range of 350 nm to 1,000 nm, such as 400 nm to 800 nm, such as 500 nm to 700 nm, such as 600 nm to 700 nm, such as 650 nm.

The semiconductor layer 22 can be any conventional solar cell semiconductor material, such as crystalline silicon. Examples include monocrystalline silicon, polycrystalline silicon, and amorphous silicon. Other examples of semiconductor material include cadmium telluride and copper indium celenide/sulfide. In a typical silicon solar cell, a layer of phosphorous-doped (n-type) silicon is on top of a thicker boron-doped (p-type) silicon. An electrical field is created at the small p-n junction resulting in a flow of current when the cell is connected to an electrical load. An amorphous silicon layer 22 can have a thickness in the range of 200 nm to 1,000 nm, such as 200 nm to 800 nm, such as 300 nm to 500 nm, such as 300 nm to 400 nm, such as 350 nm.

The second conductive layer 24 can be a metallic layer or a metal containing layer and can include one or more metal oxide materials. Examples of suitable metal oxide materials include, but are not limited to, oxides of one or more of Zn, Fe, Mn, Al, Ce, Sn, Sb, Hf, Zr, Ni, Zn, Bi, Ti, Co, Cr, Si, In, or an alloy of two or more of these materials, such as zinc stannate. The metal containing layer 24 can have a thickness in the range of 50 nm to 500 nm, such as 50 nm to 300 nm, such as 50 nm to 200 nm, such as 100 nm to 200 nm, such as 150 nm.

The optional second substrate 26, if present, can be of any material described above for the first substrate 12. The first substrate 12 and second substrate 26 can be of the same or different material and can be of the same or different thickness.

The undercoating 18, TCO layer 20, semiconductor layer 22, and the second conductive layer 24 can be formed over at least a portion of the substrate 12 by any conventional method, such as but not limited to, spray pyrolysis, chemical vapor deposition (CVD), or magnetron sputtered vacuum deposition (MSVD). The layers can all be formed by the same method or different layers can be formed by different methods. For example, the optional undercoating layer 18 and TCO layer 20 can be formed by a CVD method. In a CVD method, a precursor composition is carried in a carrier gas, e.g., nitrogen gas, and is directed toward the heated substrate. In one practice of the invention, the TCO layer 20 is formed by a CVD coating system in a molten tin bath as described below.

Selective Deposition of TCO Layer

Figure 2:
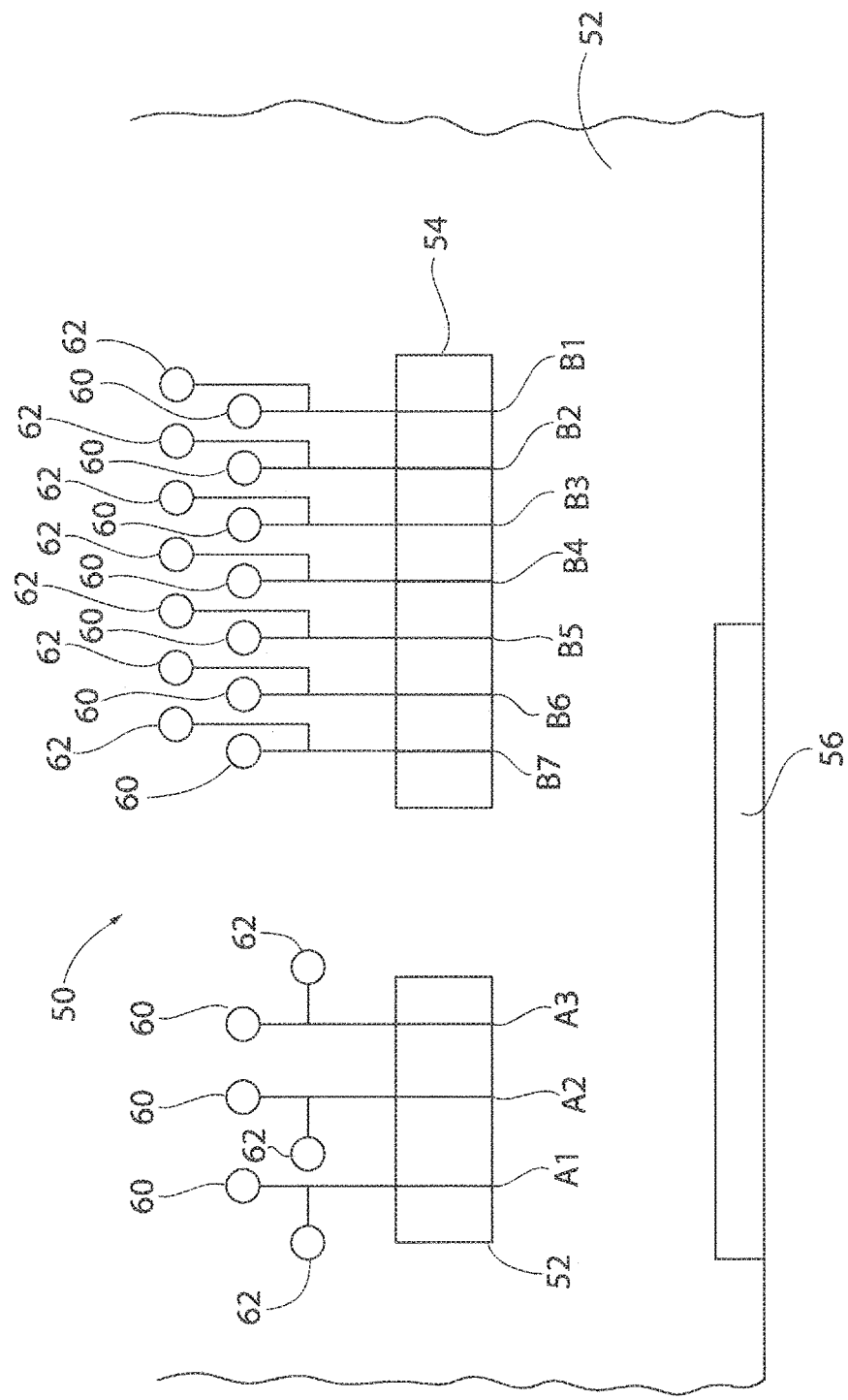
FIG. 2 is a side, prospective view of a chemical vapor deposition (CVD) coating system (not to scale) incorporating features of the invention.

In one preferred practice of the invention and illustrated in FIG. 2, the TCO layer 20 is deposited using a CVD coating system 50 positioned in a molten metal (tin) tin bath 52 of a conventional float glass process. The CVD coating system 50 can have one coater or a plurality of coaters. In the embodiment shown in FIG. 2, the coating system has a first CVD coater 54 and a second CVD coater 54. However, any desired number of coaters could be used. Each coater 52 and 54 has a plurality of coating cells (e.g., coating slots) to supply coating material onto an underlying glass substrate 56 as the glass substrate 56 moves along on top of the molten metal in the molten metal bath. The general structure and operation of a CVD coater and a conventional float glass process will be well understood by one of ordinary skill in the art and, therefore, will not be described in detail.

In the illustrated embodiment, the first coater 52 has three coating cells A1-A3 and the second coater 54 has seven coating cells B1-B7. This cell numbering is arbitrary and is presented simply to aid in discussion of the process described below. Each coating cell can be connected to a manifold to supply a coating composition to the glass. Alternatively, one or more of the cells or a set of the cells can be individually connected to a supply of a coating precursor material and/or a supply of a dopant precursor material. These connections can be via pipes, conduits, or any other conventional methods. In FIG. 2, the coating cells B1-B7 of the second coater 54 are each individually connected to a respective coating precursor supply 60 and a dopant precursor supply 62. The first coater 52 can also be configured in similar manner. In one practice of the invention, the first coater 52 can be used to apply an undercoating on the glass and the second coater 54 can be used to supply a top coat, e.g. TCO coating having a selected dopant profile, as described below. While in the preferred embodiment illustrated in FIG. 2 each of the coating cells is individually connected to a coating precursor supply 60 and a dopant precursor supply 62, it is to be understood that two or more of the cells could be connected to the same coating precursor supply 60, such as by a manifold, if desirable for a particular coating configuration. Further, if desired, a dopant precursor supply 62 could be operatively connected to two or more of the coating precursor supply 60 conduits, if acceptable for the desired final coating composition.

The coating precursor supplies 60 are a source or container containing the precursor materials that, when directed onto the hot glass 56, react or break down to form a coating of a desired composition. To form an oxide coating, the coating precursor material can include materials that, when directed onto the hot glass 56, react or combine with oxygen to form an oxide. Examples of materials include precursors for oxides of one or more of Zn, Fe, Mn, Al, Ce, Sn, Sb, Hf, Zr, Ni, Zn, Bi, Ti, Co, Cr, Si, In, or an alloy of two or more of these materials, such as zinc stannate. Such precursor materials are commercially available and can be selected based on a desired coating composition. For example, monobutyltin trichloride (MBTC) is a precursor for tin oxide coatings, tetraethylorthosilicate (TEOS) is a precursor for silica coatings, triisobutylaluminum (TIBAL) is a precursor for alumina coatings.

The dopant precursor supplies 62 are a source or container containing a material or dopant to be mixed with the coating precursor material prior to deposition of the coating material onto the glass surface. Common dopant materials include F, In, Al, P, Cu, Mo, Ta, Ti, Ni, Nb, W, and/or Sb. For example, tungsten hexafluoride is a precursor for tungsten, trifluoroacetic acid (TFA) is a precursor for fluorine. Such precursor materials are commercially available and can be selected based on a desired dopant.

The coating composition supplied onto the glass 56 can be varied at each coating cell by selecting or varying the amount or the ratio of the coating precursor material and the dopant precursor material supplied to the individual cells of the coater from the various coating supplies. For example and for purposes of illustration, each cell can be connected to a supply of a tin oxide precursor material (such as MBTC) as the coating precursor supply 60 and a fluorine precursor material (such as TFA) as the dopant precursor supply 62. As will be appreciated, the cells can also be connected to other supplies typical for a CVD coating process, such as a carrier gas supply (such as nitrogen or oxygen) and a water source supply, etc. However, for ease of discussion, these other sources are not specifically shown. By varying the ratio of the coating components (e.g., coating precursor and dopant precursor) at each cell, the dopant concentration through the resultant coating can be controlled as desired for a particular purpose.

For example, for conventional solar cells, it is desirable that the outer surface of the TCO layer is conductive (i.e., has a low sheet resistance). In prior methods, this was achieved by adding a conductive dopant to a coating precursor material to form a coating composition and then applying the coating composition onto the glass surface. The resultant coating had the dopant uniformly distributed throughout the coating. While this coating did have a conductive outer surface, the dopant located away from the outer surface deeper in the coating contributed little to the surface conductivity of the coating and actually was a detriment to the overall coating transparency. In the present invention, the dopant concentration can be skewed or selectively limited to the outer part (upper portion) of the TCO coating to provide a desired sheet resistance but not be present in the depth of the coating to adversely impact upon the transmission of the layer.

Alternatively, if it is desired that the outer surface of the tin oxide coating have a high sheet resistance but that the coating be conductive, the dopant material can be preferentially added to be near the bottom of the coating and not present near the top of the layer.

Or, should it be desired to have several regions of the coating with more dopant material than other regions, this also can be achieved by selective addition of the dopant material to selected cells of the CVD coater(s).

While in the above preferred embodiment individual coating precursor supplies 60 and dopant precursor supplies 62 were in flow communication with the coating cells, it is also possible that individual coating cells are each connected to a single coating source having a mixture of a coating precursor material and a dopant precursor material, with the ratio of these components being different between the different coating sources connected to different coating cells.

The following Examples are provided to illustrate various non-limiting aspects of the invention. However, it is to be understood that the invention is not limited to these specific Examples.

EXAMPLES

The following examples illustrate a fluorine doped tin oxide coating formed using a tin oxide coating precursor material (MBTC) and a fluorine dopant precursor material (TFA). However, it is to be understood that this is just to illustrate the general concepts of the invention and the invention is not limited to these specific materials.

Each of the following examples used clear glass substrates having a thickness of 3.2 mm. The TCO coating was deposited by a second coater 54 as described above to have a thickness of 665 nm. Cells B1-B7 were used. Each cell had a tin precursor (MBTC) flow rate of 52.3 pounds per hour (lb/hr) and a water flow rate of 14.6 lb/hr. The amount of fluorine precursor (TFA) for each cell was varied as described in each Example. In the examples, the glass movement was from left to right in FIG. 2. That is, cell B7 was the first active cell of the second coater 54 encountered by the glass 56 and cell B1 was the last cell encountered by the glass. After the coating was formed, the coating was sputter probed using x-ray photoemission spectrometry to determine the change in fluorine concentration versus coating depth. The sputter time is an indication of depth, with one second of sputter time equal to about 1.5 Angstroms.

Example 1

Figure 3:
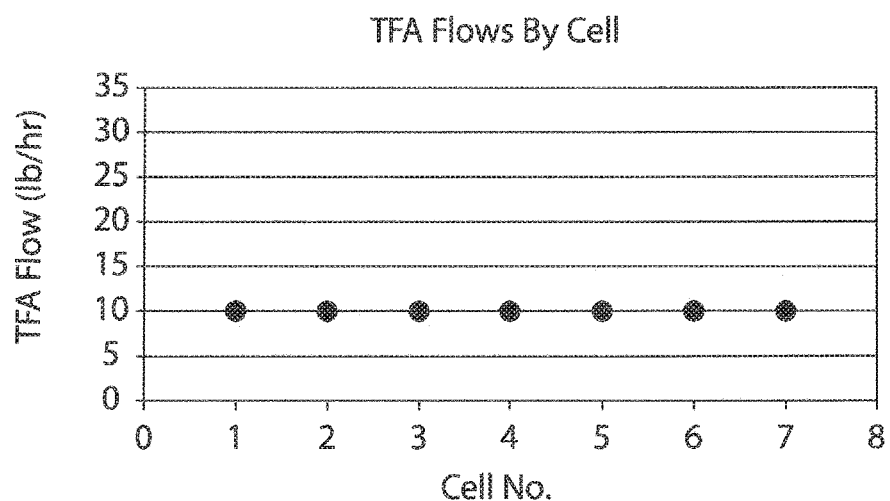
FIG. 3 is a graph of TFA flow (lb/hr) versus cell number for Example 1.
Figure 4:
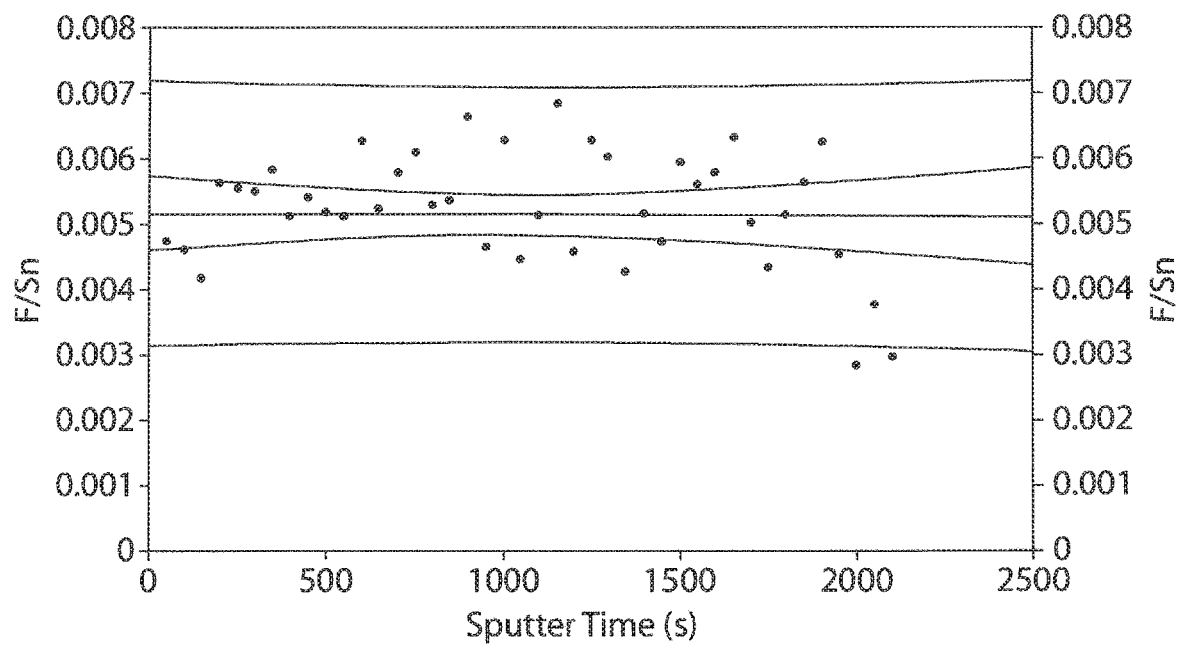
FIG. 4 is a graph of F/Sn ratio versus coating depth for Example 1.

TFA was supplied to each cell as set forth in FIG. 3. This example used a uniform TFA flow rate to each cell. The coating was sputter probed and the results shown in FIG. 4. As can be seen from FIG. 4, the fluorine concentration was relatively uniform through the coating depth. The TCO coating had a sheet resistance of 8.6Ω/□, a light transmittance of 82.6 percent, and a haze of 0.96 percent.

Example 2

Figure 5:
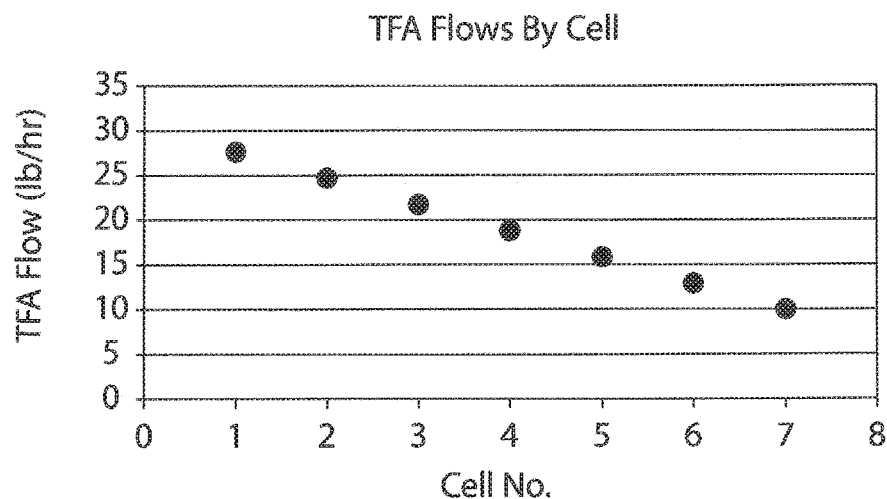
FIG. 5 is a graph of TFA flow (lb/hr) versus cell number for Example 2.
Figure 6:
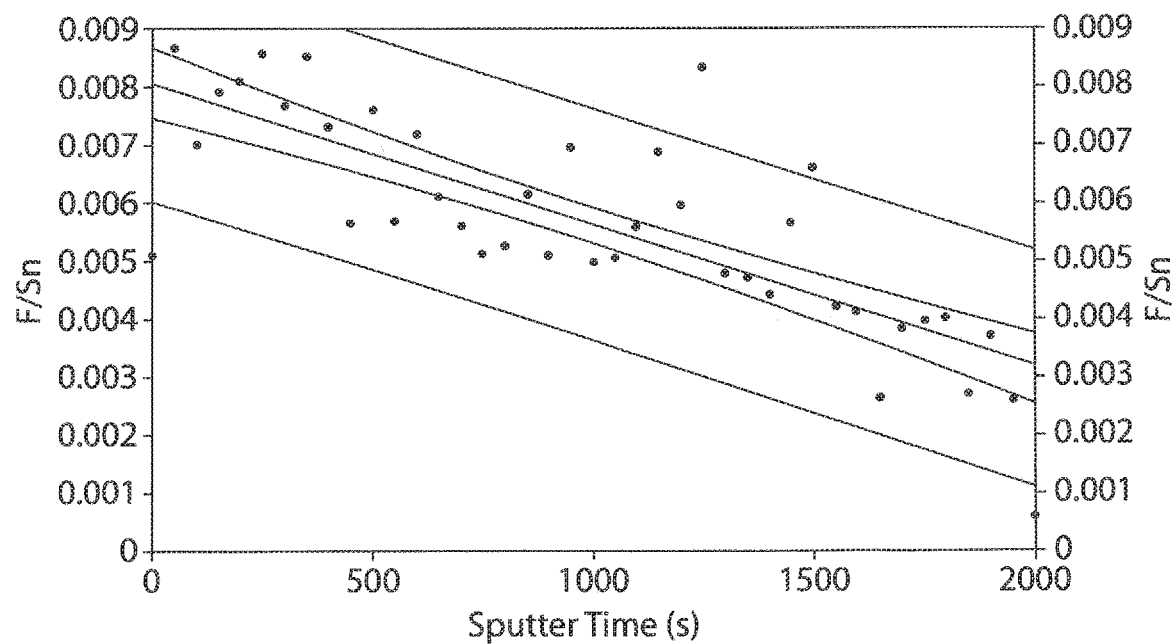
FIG. 6 is a graph of F/Sn ratio versus coating depth for Example 2.

TFA was supplied to each cell as set forth in FIG. 5. This example used a lower initial TFA flow rate. The coating was sputter probed and the results shown in FIG. 6. As can be seen, the fluorine concentration was lower at the bottom of the coating and higher at the top of the coating. The TCO coating had a sheet resistance of 8.8Ω/□, a light transmittance of 82.8 percent, and a haze of 0.79 percent.

Example 3

Figure 7:
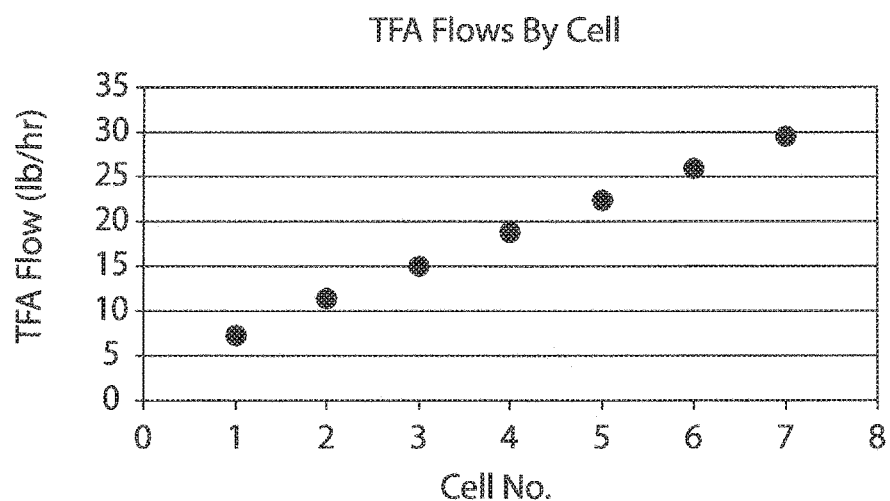
FIG. 7 is a graph of TFA flow (lb/hr) versus cell number for Example 3.
Figure 8:
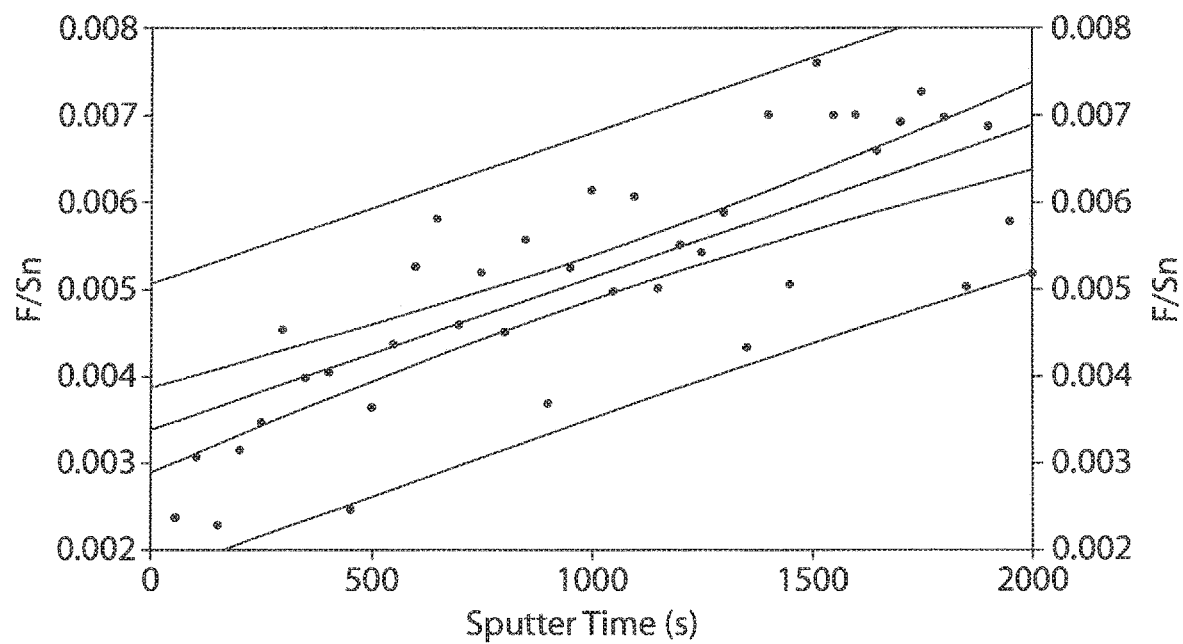
FIG. 8 is a graph of F/Sn ratio versus coating depth for Example 3.

TFA was supplied to each cell as set forth in FIG. 7. This example used a higher initial TFA flow rate and a lower final flow rate. The coating was sputter probed and the results shown in FIG. 8. As can be seen, the fluorine concentration was higher at the bottom of the coating and lower at the top of the coating. The TCO coating had a sheet resistance of 9.4Ω/□, a light transmittance of 82.1 percent, and a haze of 1.09 percent.

Example 4

Figure 9:
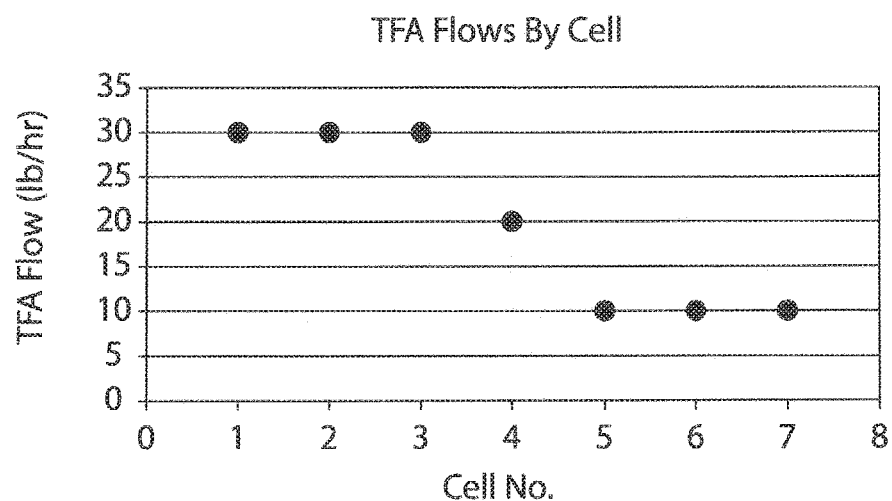
FIG. 9 is a graph of TFA flow (lb/hr) versus cell number for Example 4.
Figure 10:
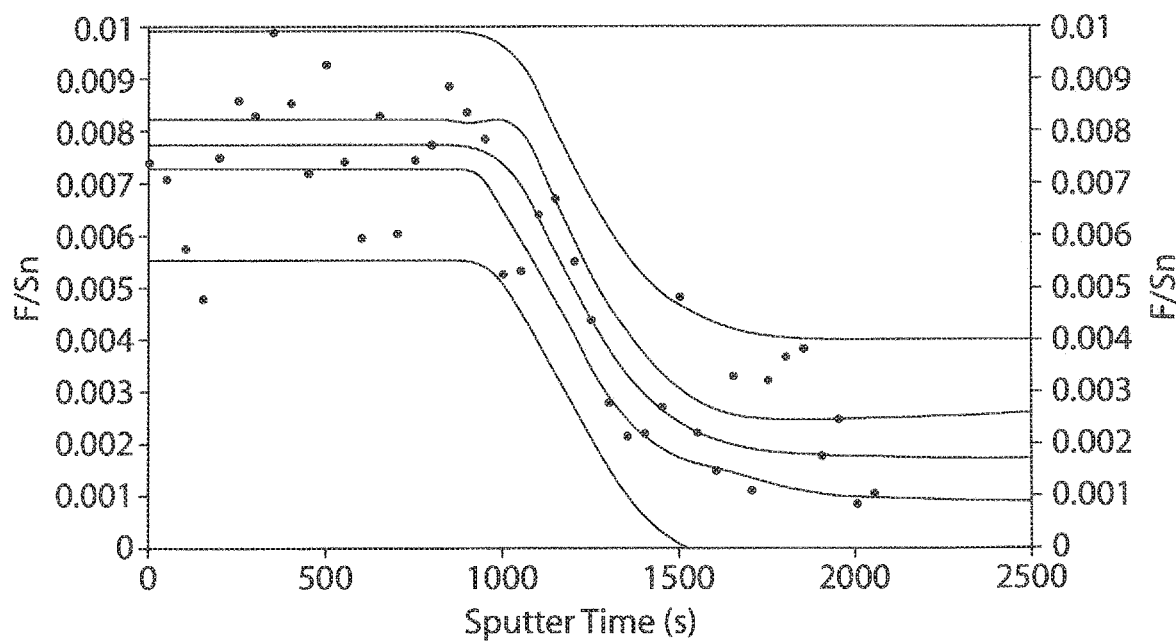
FIG. 10 is a graph of F/Sn ratio versus coating depth for Example 4.

TFA was supplied to each cell as set forth in FIG. 9. This example used a low initial TFA flow rate, an intermediate flow rate, and then a high flow rate. The coating was sputter probed and the results shown in FIG. 10. As can be seen, the fluorine concentration was lower at the bottom of the coating and higher at the top of the coating and had a transition zone near the middle of the coating. The TCO coating had a sheet resistance of 9.0Ω/□, a light transmittance of 82.7 percent, and a haze of 0.80 percent.

Example 5

Figure 11:
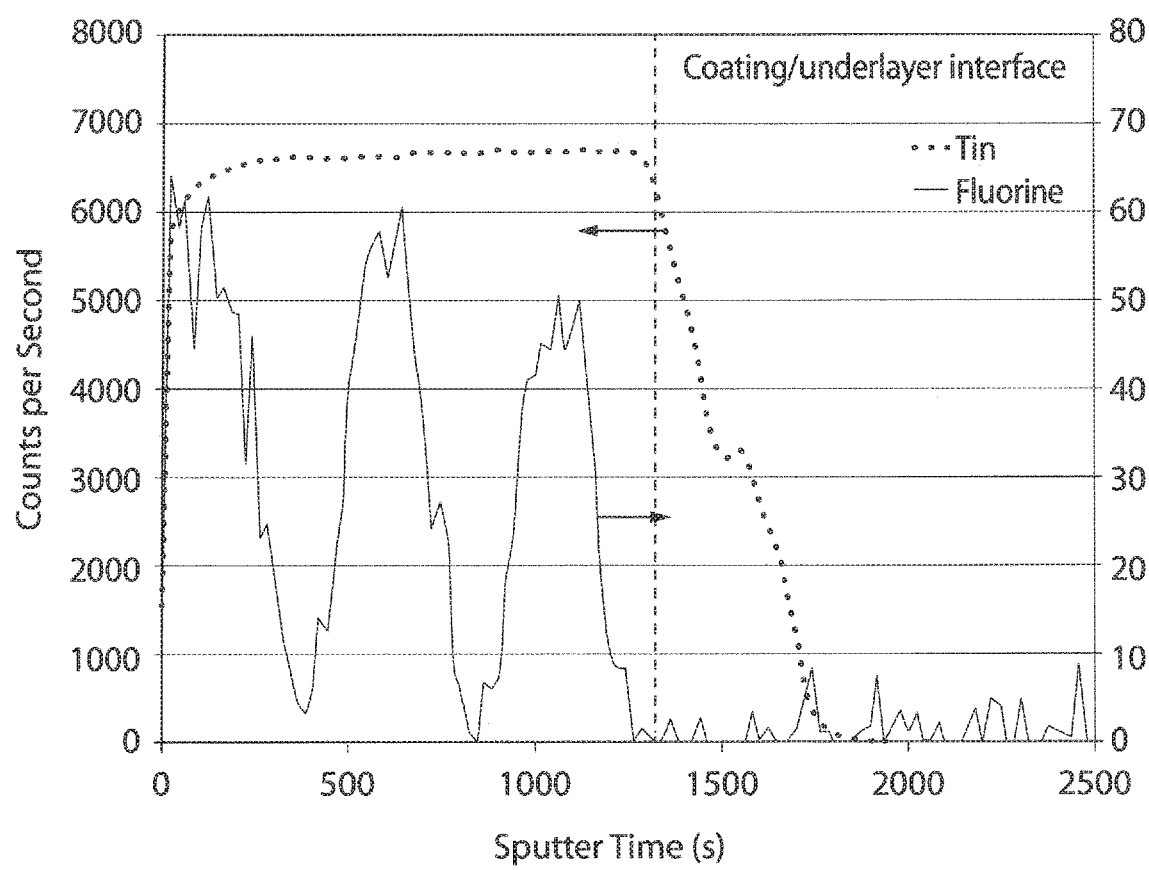
FIG. 11 is a graph of fluorine and tin content versus coating depth for Example 5.
Figure 12:
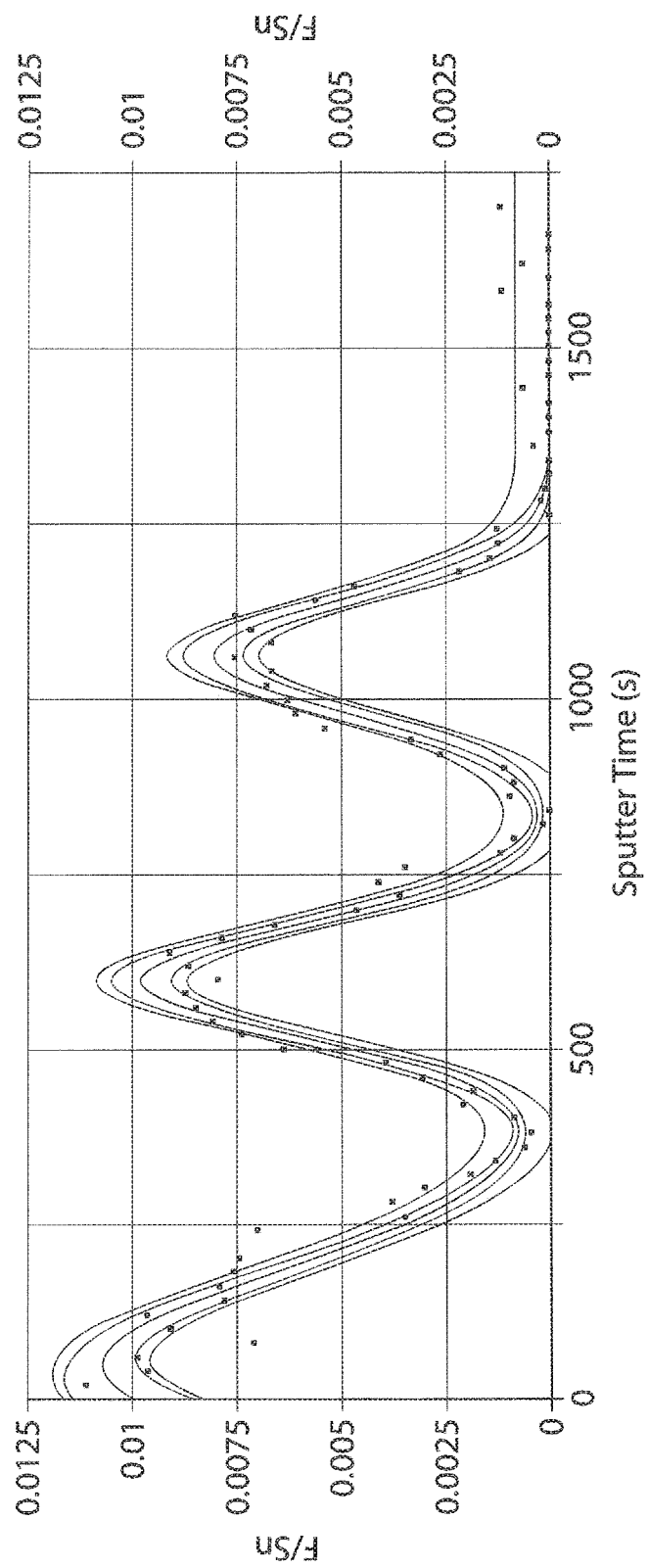
FIG. 12 is a graph of F/Sn ratio versus coating depth for Example 5.

This example shows a TCO coating with discrete step changes in fluorine composition as a function of coating depth. The substrate was 3.2 mm clear glass and the coating had a thickness of 385 nm. Six coater cells were used. The MBTC flow rate was 43.6 lb/hr and the water flow rate was 7.9 lb/hr. The TFA flow rate was 8.2 lb/hr in cell 5, 14.03 lb/hr in cells 1 and 3, and 0 lb/hr in cells 2, 4, and 6. The coating had the composition profile shown in FIG. 11. FIG. 12 shows the F/Sn ratio versus depth for the coating. Discrete areas of fluorine composition were formed in the coating. The TCO coating had a sheet resistance of 21.0Ω/□, a light transmittance of 84.1 percent, and a haze of 0.70 percent.

Example 6

This example illustrates a TCO having a step change in fluorine composition as a function of depth to enable the control of haze while maintaining a constant sheet resistance. The glass was a low-iron glass having a thickness of 4.0 mm. Eight coating cells were used. Cell A3 of the first coater is designated "cell 8" in this example and cells 1-7 refer to cells B1-B7 described above. Each cell had an MBTC, Water, and TFA flow rate as shown in Table 1. All values are in lbs/hr.

TABLE 1

| | Cell 8 | | | Cells 7-5 | | | Cells 4-1 | | |
|---|---|---|---|---|---|---|---|---|---|
| Sample # | MBTC | Water | TFA | MBTC | Water | TFA | MBTC | Water | TFA |
| 1 | 12.4 | 2.85 | 0 | 28 | 6.1 | 0 | 49.0 | 11.3 | 1.8 |
| 2 | 12.4 | 2.85 | 0 | 43 | 9.7 | 0 | 55.0 | 12.7 | 1.4 |
| 3 | 12.4 | 2.85 | 0 | 64 | 14.4 | 0 | 63.0 | 14.4 | 1.5 |

The coatings had the haze and sheet resistance values shown in Table 2. Thickness values are in nm, haze is in percent, and sheet resistance is in ohms per square.

TABLE 2

| Sample # | Total Thickness | Undoped Thickness | Doped Thickness | Haze | Sheet Resistance |
|---|---|---|---|---|---|
| 1 | 900 | 350 | 550 | 7.6 | 9.9 |
| 2 | 1175 | 575 | 600 | 13.2 | 10.7 |
| 3 | 1310 | 710 | 600 | 16.8 | 9.9 |

Figure 13:
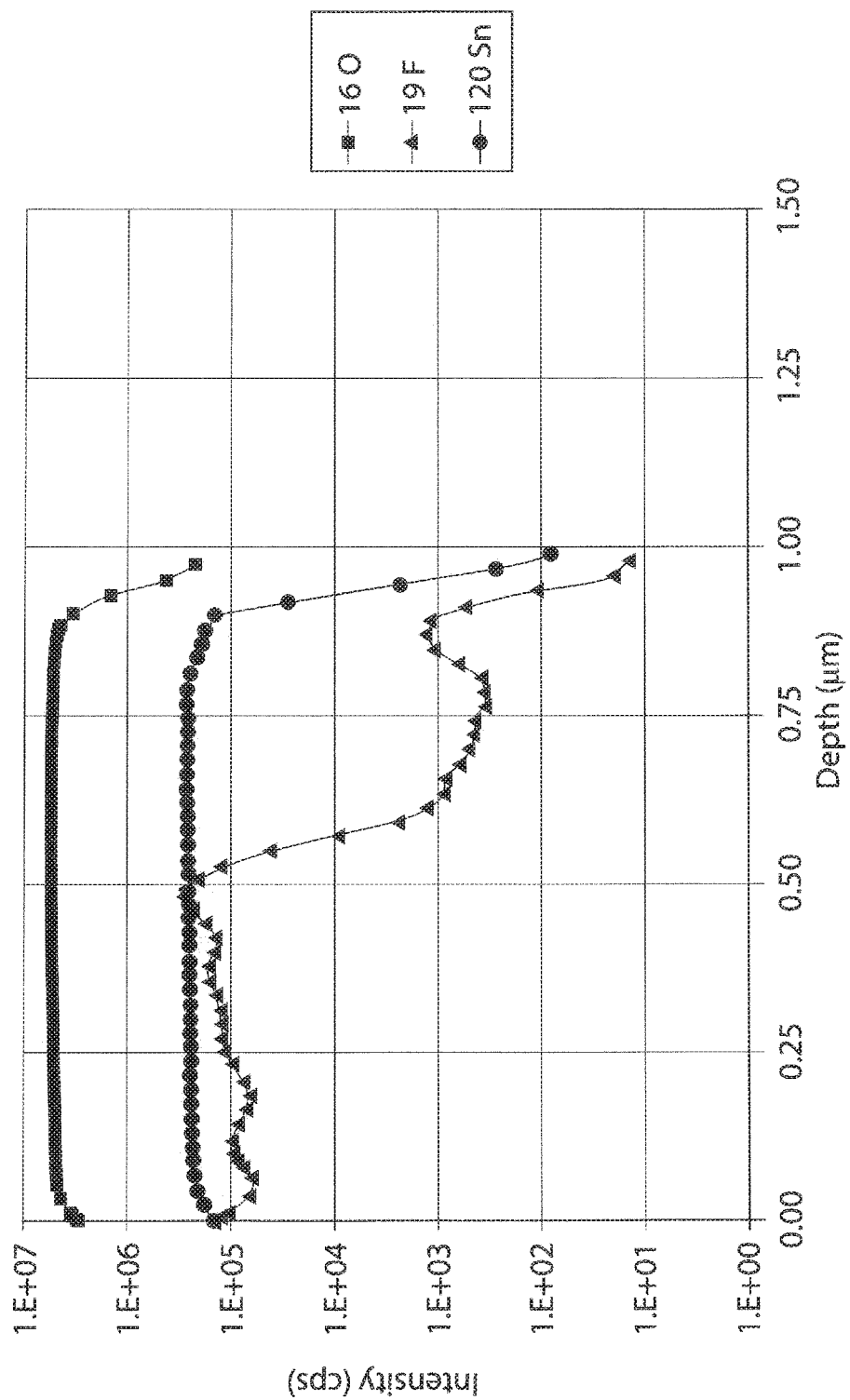
FIG. 13 is a graph of tin, oxygen, and fluorine content versus coating depth for Sample 1 of Example 6.
Figure 14:
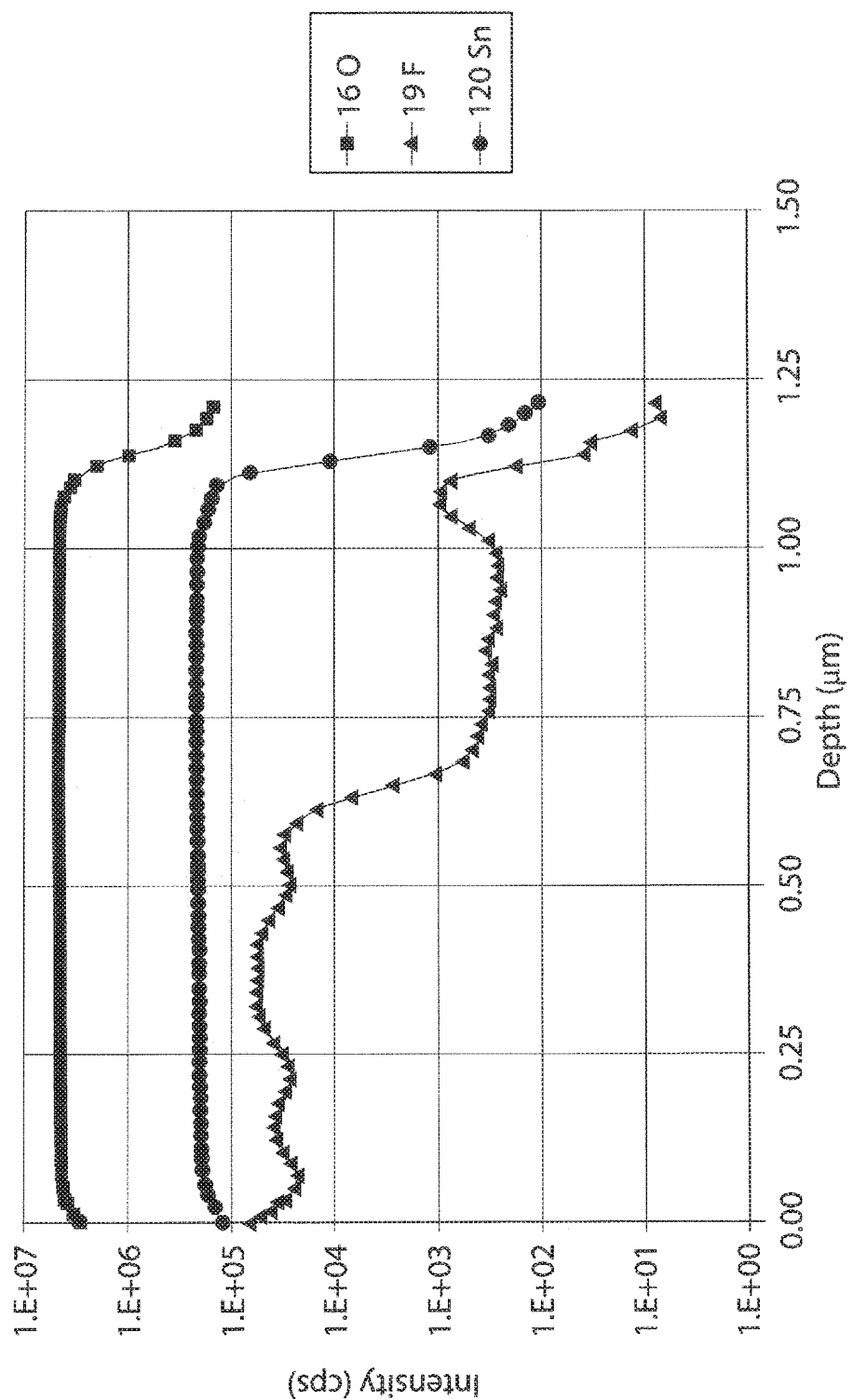
FIG. 14 is a graph of tin, oxygen, and fluorine content versus coating depth for Sample 2 of Example 6.
Figure 15:
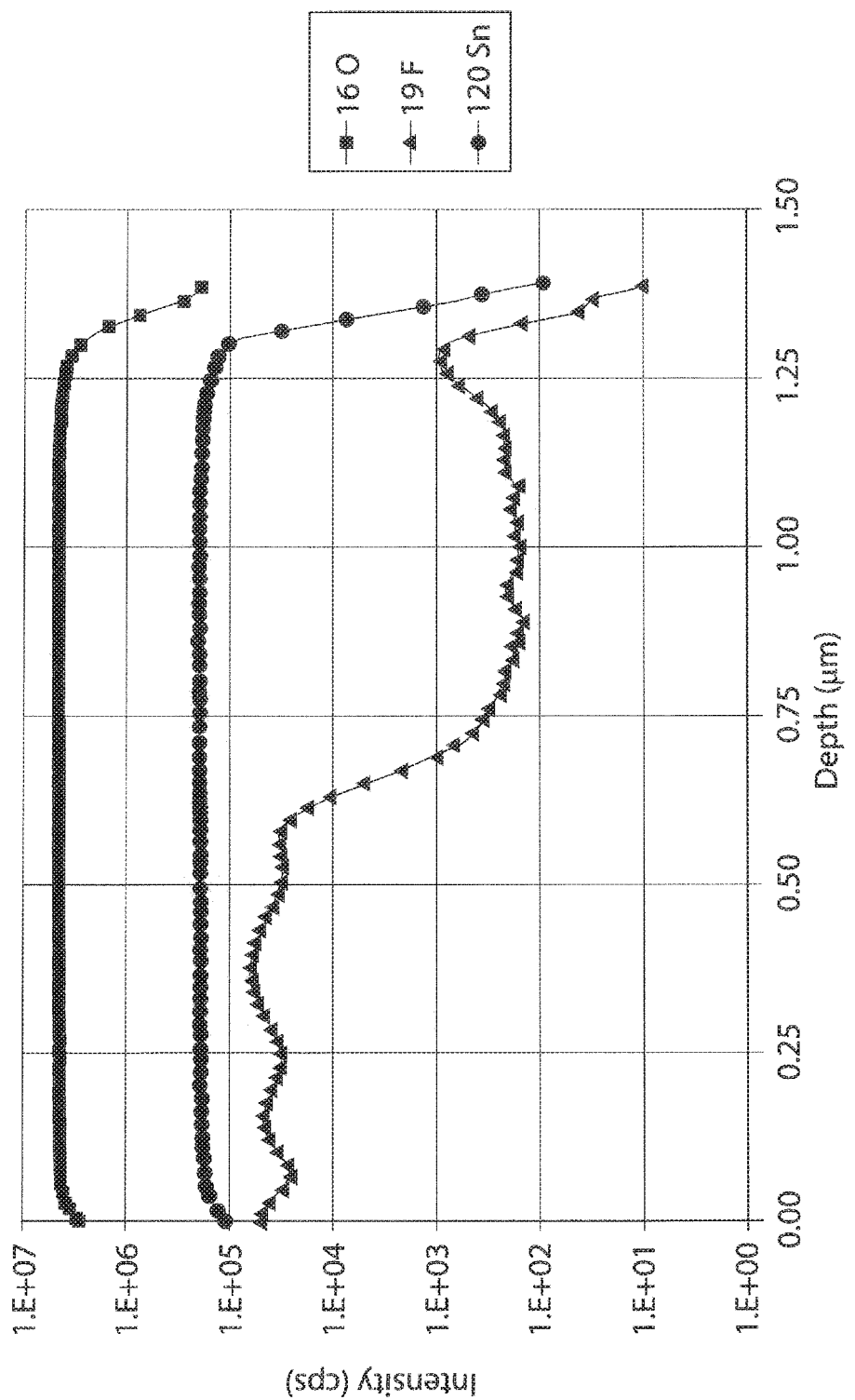
FIG. 15 is a graph of tin, oxygen, and fluorine content versus coating depth for Sample 3 of Example 6.

FIG. 13 is a graph showing the oxygen, tin, and fluorine versus depth for Sample 1. FIG. 14 is a graph showing the oxygen, tin and fluorine content versus depth for Sample 2. FIG. 15 is a graph showing oxygen, tin, and fluorine content versus depth for Sample 3.

Figure 16:
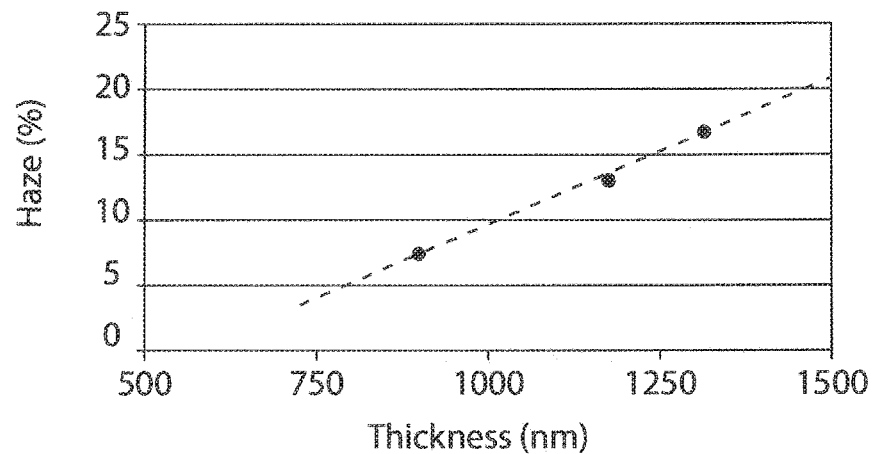
FIG. 16 is a graph of percent haze versus coating thickness for Example 6.
Figure 17:
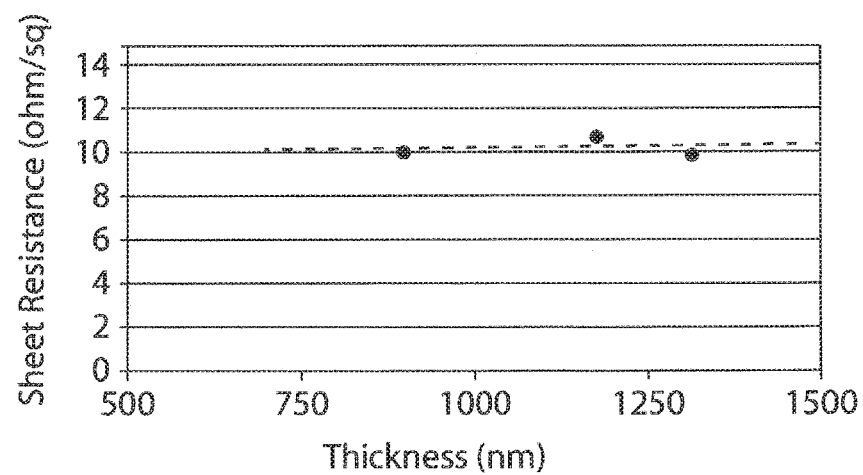
FIG. 17 is a graph of sheet resistance versus coating thickness for Example 6
Figure 18:
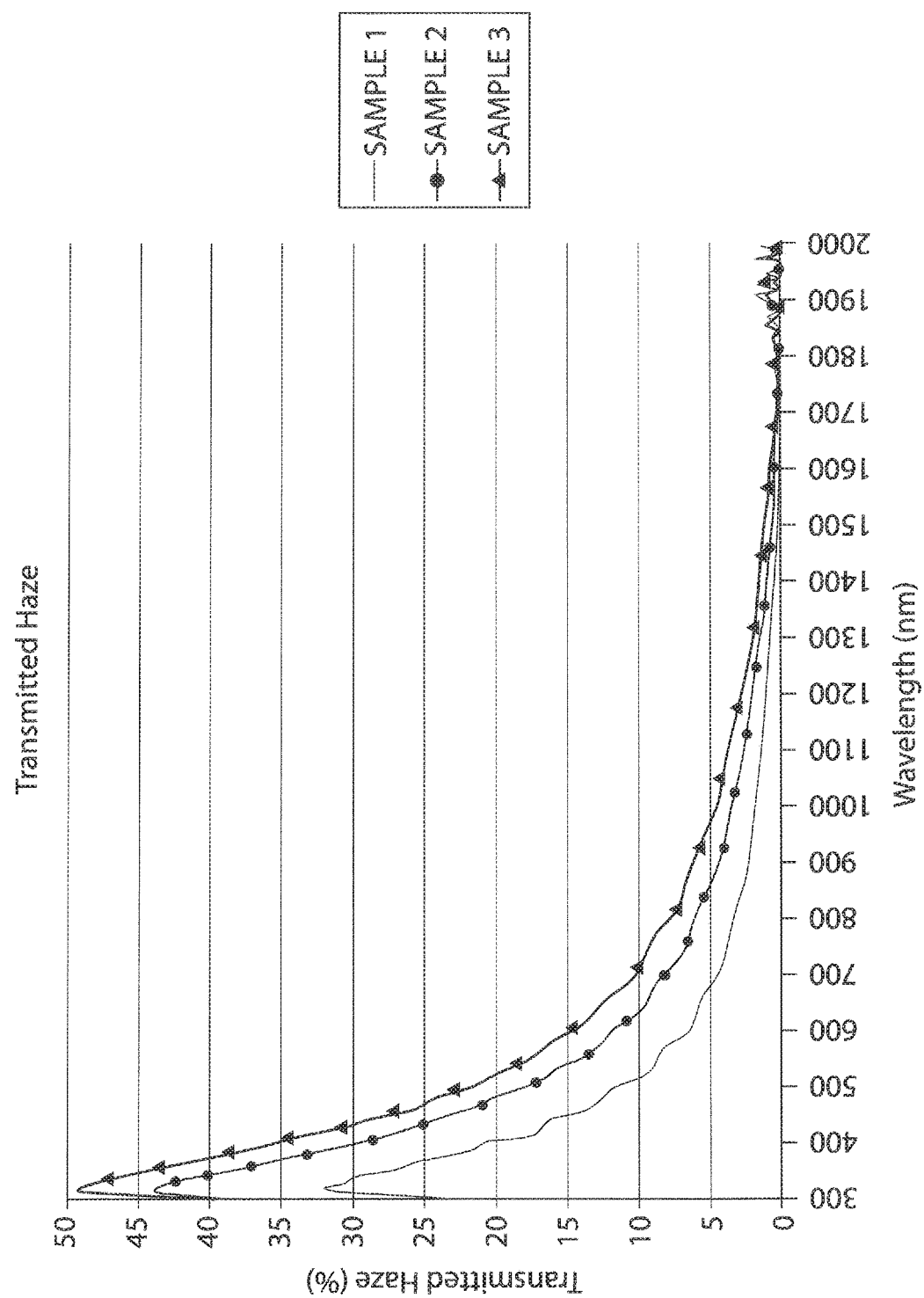
FIG. 18 is a graph of haze versus wavelength for Example 6.

FIG. 16 shows the total layer thickness versus haze for Samples 1-3. As can be seen, as the thickness increases, the haze increases. FIG. 17 shows coating thickness versus sheet resistance for Samples 1-3. As can be seen, the sheet resistance remained relatively constant even as the coating thickness increased. FIG. 18 is a graph of transmitted haze versus wavelength for Samples 1-3.

It will be readily appreciated by those skilled in the art that modifications may be made to the invention without departing from the concepts disclosed in the foregoing description. Accordingly, the particular embodiments described in detail herein are illustrative only and are not limiting to the scope of the invention, which is to be given the full breadth of the appended claims and any and all equivalents thereof.

The invention claimed is:

1. A solar cell comprising
a first substrate having a first surface and a second surface;
a first conductive layer over at least a portion of the second surface, the first conductive layer comprising zinc stannate doped with a dopant having a non-uniform profile, wherein the first conductive layer comprises a first portion having a dopant, a second portion over the first portion having an amount of dopant, the amount of dopant being less than an amount of dopant in the first portion, a third portion over the second portion having more dopant than the amount of dopant in the second portion and less dopant than the first portion; a fourth portion having less dopant than the first, second, and third portion; and a fifth portion having less dopant than the first and third portions and more dopant than the second and fourth portions;
a semiconductor layer over the first conductive layer; and
a second conductive layer over at least a portion of the semiconductor layer.

2. The solar cell of claim 1, further comprising an undercoating layer between the second surface and the first conductive layer.

3. The solar cell of claim 1, further comprising a second substrate over the second conductive layer.

4. The solar cell of claim 1, wherein the dopant material is selected from the group consisting of F, In, Al, P, and Sb.

5. The solar cell of claim 1, wherein the dopant material comprises fluorine.

6. The solar cell of claim 1, wherein the semiconductor layer is selected from monocrystalline silicon, polycrystalline silicon, amorphous silicon, cadmium telluride, and copper indium selenide/sulfide.

* * * * *